(12) United States Patent
Ernstberger et al.

(10) Patent No.: US 9,054,143 B2
(45) Date of Patent: Jun. 9, 2015

(54) PACKAGING FOR SUBSTRATES AND PACKAGING UNIT HAVING SUCH PACKAGING

(75) Inventors: Erich Ernstberger, Windischeschenbach (DE); Heiko Schweiger, Vorbach (DE); Tomas Block, Boxberg OL (DE)

(73) Assignee: ROGERS GERMANY GMBH, ESCHENBACH (DE)

( * ) Notice: Subject to any disclaimer, the term of this patent is extended or adjusted under 35 U.S.C. 154(b) by 0 days.

(21) Appl. No.: 14/122,102

(22) PCT Filed: Jul. 6, 2012

(86) PCT No.: PCT/DE2012/100205
§ 371 (c)(1),
(2), (4) Date: Jan. 29, 2014

(87) PCT Pub. No.: WO2013/017124
PCT Pub. Date: Feb. 7, 2013

(65) Prior Publication Data
US 2014/0166533 A1    Jun. 19, 2014

(30) Foreign Application Priority Data

Jul. 29, 2011   (DE) .......................... 10 2011 108 834
Sep. 19, 2011   (DE) .......................... 10 2011 113 650

(51) Int. Cl.
*B65D 85/48* (2006.01)
*H01L 21/673* (2006.01)

(52) U.S. Cl.
CPC .... *H01L 21/67383* (2013.01); *H01L 21/67333* (2013.01); *H01L 21/67363* (2013.01); *H01L 21/67369* (2013.01); *H01L 21/67386* (2013.01)

(58) Field of Classification Search
USPC ......... 206/701, 710, 711, 712, 562, 564, 725, 206/722
See application file for complete search history.

(56) References Cited

U.S. PATENT DOCUMENTS

| 5,025,924 | A  | * | 6/1991 | Watanabe ..................... 206/454 |
| 5,547,082 | A  | * | 8/1996 | Royer et al. .................. 206/725 |
| 5,706,951 | A  | * | 1/1998 | Oinuma et al. ............... 206/710 |
| 5,887,721 | A  |   | 3/1999 | Betsuyaku |
| 8,240,474 | B1 | * | 8/2012 | Mossberg et al. ............. 206/449 |
| 2009/0090653 | A1 |   | 4/2009 | Forsyth |
| 2011/0089079 | A1 |   | 4/2011 | Lo |
| 2011/0127191 | A1 | * | 6/2011 | Biar .............................. 206/564 |
| 2011/0132789 | A1 | * | 6/2011 | Peng et al. .................... 206/505 |

FOREIGN PATENT DOCUMENTS

| JP | H03-026768 | 3/1991 |
| JP | H06-041313 | 6/1994 |
| JP | H09-095387 | 4/1997 |
| JP | 2001110888 | 4/2001 |
| JP | 2003-292049 | 10/2003 |
| JP | 2005231704 | 9/2005 |
| WO | WO 2007/013205 | 2/2007 |

* cited by examiner

*Primary Examiner* — Jacob K Ackun
(74) *Attorney, Agent, or Firm* — Welsh Flaxman & Gitler LLC

(57) ABSTRACT

A packaging for substrates, in particular for metal-ceramic substrates, having a tray-like packaging part formed from a sheet material, for example a plastic sheet material by deep drawing. The packaging has at least one seat formed by an indentation in an upper base section of the packaging part for a plurality of substrates collected together into a substrate stack or part stack.

16 Claims, 11 Drawing Sheets

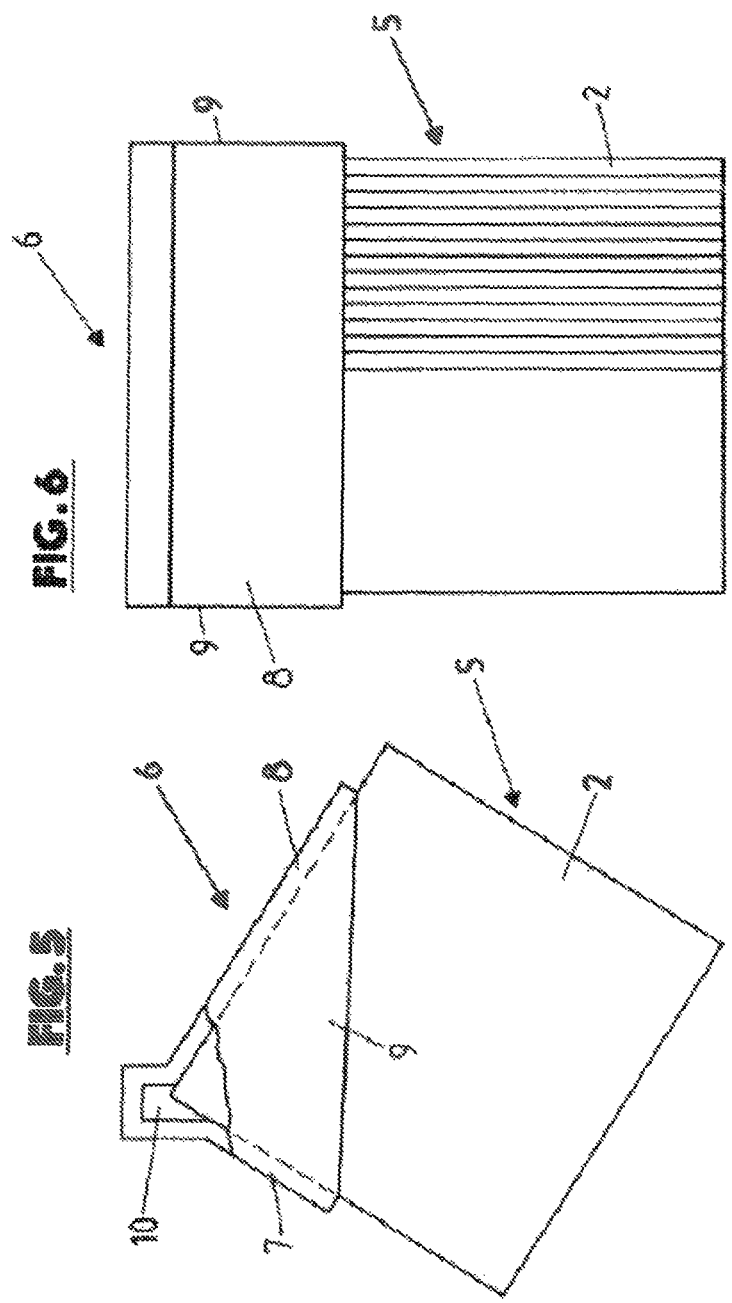

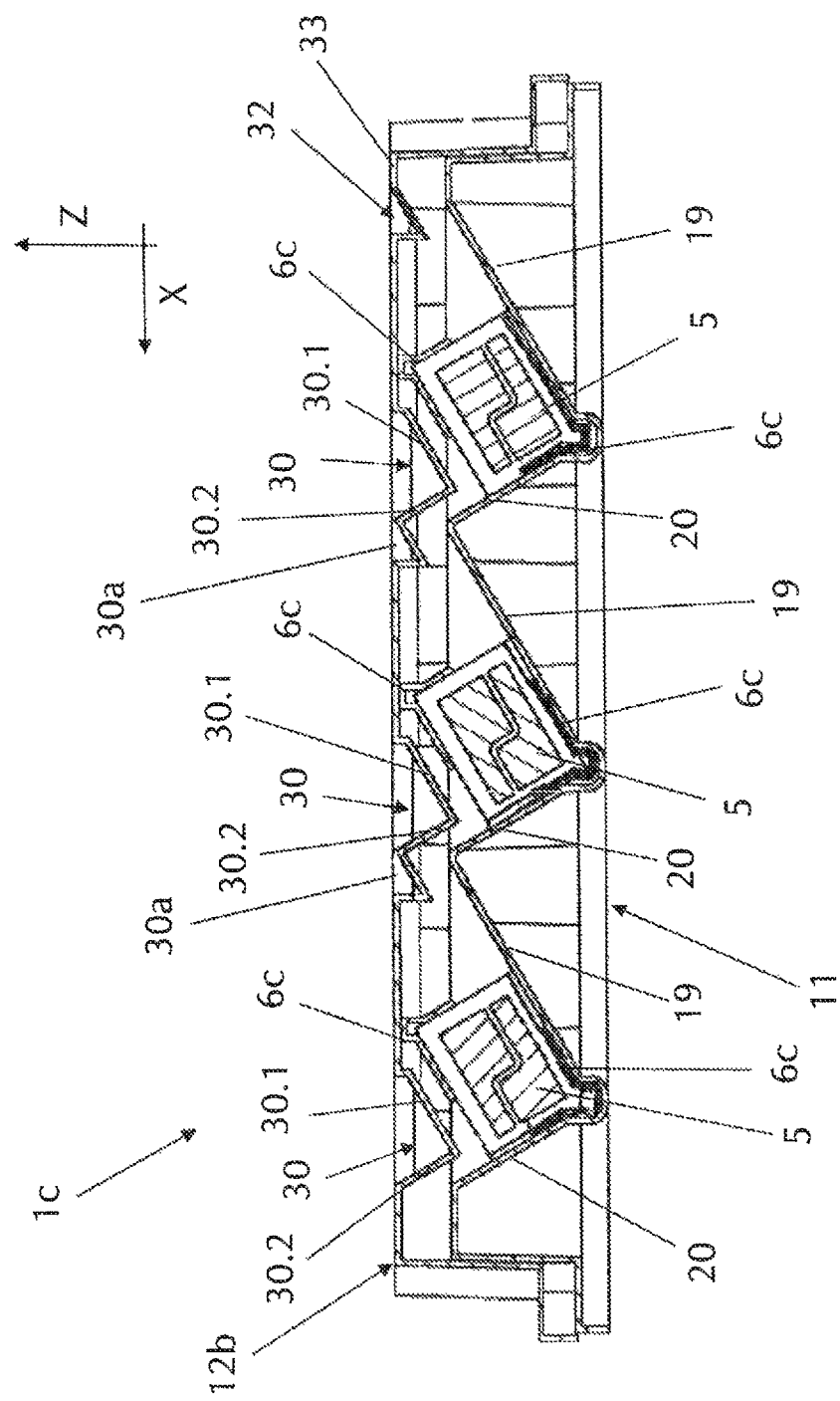

PACKAGING FOR SUBSTRATES AND PACKAGING UNIT HAVING SUCH PACKAGING

BACKGROUND OF THE INVENTION

The invention relates to packaging for metal-ceramic substrates having a tray-like packaging part formed from a sheet material. The invention is also directed to a packaging unit for a substrate stack or part stack.

Metal-ceramic substrates, in particular those in the form of circuit boards for electrical and electronic circuits or modules, as well as methods for the manufacture of such substrates are known. As a rule, such substrates consist of a ceramic insulating layer which is provided on both surfaces with a metallization. This latter is, for example, produced from a metal foil, for example of copper, or a copper alloy, which is flat bonded with the ceramic insulating layer using a suitable assembly method.

An example of the assembly method is the so-called "DCB method" (direct copper bond technology), for example, for bonding metal layers or sheets (for example copper sheets or foils) together and/or to ceramics or ceramic layers, using metal or copper sheets, or metal or copper foils, which have a layer or coating ("melt layer") on the surfaces formed from a chemical compound formed from the metal and a reactive gas, preferably oxygen. In this method, described, for example, in U.S. Pat. No. 3,744,120 or in DE-PS 23 19 854, this layer or coating ("melt layer") forms a eutectic with a melting point that is below the melting point of the metal (for example copper), so that by applying the foil to the ceramic and heating all of the layers, they can be bonded together by melting the metal or copper only in the zone of the melt layer or oxide layer.

Such a DCB method then, for example, has the following process steps:
  oxidizing a copper foil in a manner so as to produce a uniform copper oxide layer;
  applying the copper foil to the ceramic layer;
  heating the assembly to a process temperature between about 1025° C. and 1083° C., for example to about 1071° C.;
  cooling to room temperature.

Similar to the DCB method cited above for direct bonding of copper onto copper or copper onto ceramic, other direct metal bonding methods or technologies are known by means of which, in an analogous manner, metal layers or sheets can quite generally be bonded together and/or bonded with ceramic or ceramic layers. The DCB method and the methods analogous thereto will hereinafter be termed DMB methods (direct metal bond method).

Further, the so-called active brazing method is known (DE 22 13 115; EP-A-153 168), e.g. for bonding metal layers or metal foils forming metallizations, especially copper layers or copper foils or aluminium layers or aluminium foils with a ceramic material. In that method which, for example, can also be specifically used for the manufacture of metal-ceramic substrates, a bond between a metal foil, for example copper foil, and a ceramic substrate, for example an aluminium nitride ceramic, is produced at a temperature of between approximately 800-1000° C. using a brazing solder which, in addition to a main component such as copper, silver and/or gold, also contains an active metal. This active metal which is, for example, at least one element from the group Hf, Ti, Zr, Nb and Ce, produces a bond between the brazing solder and the ceramic by a chemical reaction, while the bond between the brazing solder and the metal is a metallic brazing solder bond.

It is an object of the invention to provide packaging which allows substrates, in particular and including metal-ceramic substrates, to be transported and stored safely.

The term "substrate" as used in the context of the invention primarily means board-like products, preferably rectangular or square board-like products, for example substrates for electrical and electronic applications, in particular in the form of circuit boards and special metal-ceramic substrates.

The term "substrate stack" as used in the context of the invention refers to a stack formed from substrates sitting closely against one another and/or mutually supporting each other, wherein the thickness of the stack in the stacking direction, i.e. in the direction perpendicular to the top surfaces of the substrates, is equal to or essentially equal to the distance between the lateral structures of the at least one substrate seat in the lower portion of the packaging.

The term "part stack" as used in the context of the invention means a stack formed from at least two, but preferably from more than two substrates mutually supporting each other, wherein the thickness of the stack in the stacking direction, or perpendicular to the top surfaces of the substrates, is less than the distance between the lateral structures of the at least one substrate seat in the lower portion of the packaging.

A "packaging unit" as used in the context of the invention means the packaging which is at least partly filled with metal-ceramic substrates, preferably the packaging which is at least partly filled with metal-ceramic substrates, sealed and placed in a sealed and evacuated wrapper. The packaging unit may also contain two or more than two packagings at least partly filled with metal-ceramic substrates in a sealed and evacuated wrapper.

The expression "essentially" or "about" as used in the context of the invention mean deviations from the respective exact value by ±10%, preferably by ±5% and/or deviations in the form of differences which are irrelevant to function.

SUMMARY OF THE INVENTION

The packaging embodying the invention is disclosed wherein:
  lateral structures form contact surfaces which are disposed in a second plane (XZ plane) perpendicular to or essentially perpendicular to the first plane (XY plane); and the base of at least one indentation is formed by at least two wall sections which enclose an angle, preferably an angle of 90° or essentially 90°, and in that the wall sections are disposed in planes which enclose an angle with the first plane (XY plane) of the base section.
  The wall sections form the contact surfaces for two edge regions of the substrates (2) connected at right angles or essentially at right angles.
  The wall sections forming the base of the at least one indentation are inclined at different angles with respect to the first plane (XY plane) of the base section, with a first wall section at an angle of approximately 30°, for example, and a second wall section at an angle of approximately 60°; at least one indentation is developed from the base.
  The at least one indentation is formed at the transition between the at least two wall sections forming the base with a recess for accommodating the corner regions of the substrates.

The tray-like packaging part is formed with a circumferential edge which protrudes beyond an underside of the base section.

The edge is formed by at least two edge sections connected to each other, wherein at least one circumferential edge section protrudes in the manner of a flange over the periphery of the tray-like packaging part; and at least one cap-like protective or linking element is provided for placing on the substrate stack or part stack accommodated in or to be accommodated in the at least one indentation.

When a plurality of substrate stacks or part stacks are accommodated in or to be accommodated in a respective indentation, at least one protective or linking element is provided for each substrate stack or part stack.

When a plurality of substrate stacks or part stacks are accommodated in or to be accommodated in a respective indentation, two protective or linking elements are provided for each substrate stack or part stack.

The protective and linking element has two limbs which together form an angled profile enclosing an angle, for example an angle of 90° or essentially 90°.

In addition, the protective and linking element has two wall sections provided at the ends of the angled profile which connect the limbs together; and the transition between the limbs has a recess or enlargement to accommodate the corner regions of the substrates of the substrate stack.

Lateral structures are formed on the limbs to constitute compartments for part stacks in order to each accommodate an integral or part stack; and the tray-like packaging part comprises a plurality of indentations each for accommodating at least one substrate stack or part stack.

The tray-like packaging part is rectangular or square in plan view; and at least two indentations each for accommodating at least one substrate stack or part stack is introduced into the base section.

The tray-like packaging part comprises at least one further seat, preferably a seat forming a further indentation for accommodating a moisture-absorbing material.

The tray-like packaging part forms a lower packaging part, and the packaging additionally comprises a lid-like upper packaging part which can be placed on the tray-like packaging part, which is manufactured in the manner of a cover with an upper lid base and with a lid edge which surrounds the edge of the tray-like packaging part and is manufactured from a sheet material, for example a plastic sheet material, preferably by deep drawing.

When the packaging is closed, the base section of the upper packaging part lies against the protective or linking element placed on the at least one substrate stack or part stack.

To reduce the volume of the internal space of the closed packaging not taken up by the substrates, the lid base of the upper packaging part is formed with impressions or indentations which extend into the internal space from the outside or top of the lid base.

A first impression or indentation is provided for each substrate seat, which impression or indentation is formed parallel to the structures of the wall sections running through the substrate seat.

The lid base is formed with at least one second impression running between the first impressions or indentations and/or with a preferably circumferential impression or indentation along an edge region of the upper packaging part.

The features of the packaging may each be employed individually or in any combination.

In a further embodiment of the invention, the packaging is, for example, characterized in that:

it comprises a bag-like wrapper which accommodates the packaging and is formed from a sheet material or a foil, which wrapper forms the sealed internal space which accommodates the at least one packaging, said internal space preferably being evacuated or having a reduced internal pressure with respect to the surrounding pressure and/or filled with a protective gas; and the upper packaging part bears on the lower packaging part via the protective and linking elements and the substrate stack and/or part stack.

The features of the packaging unit may each be employed individually or in any combination.

Further embodiments, advantages and applications of the invention will become apparent from the description below of exemplary embodiments and from the Figures. In this respect, all features which are described or illustrated individually or in any combinations constitute the subject matter of the invention independently of their summarization in the claims or their dependencies. In addition, the content of the claims should be considered to form a constituent part of the description.

BRIEF DESCRIPTION OF THE DRAWINGS

The invention will now be described with the aid of the figures and examples, in which:

FIGS. 5, 6 each individually show, in side view, a stack formed from a plurality of rectangular circuit boards each formed from a metal-ceramic substrate;

FIG. 7 shows, in diagrammatic side view, a substrate in the form of a metal-ceramic substrate;

FIG. 11 shows, in a simplified sectional view similar to FIG. 4, a further embodiment of the packaging or packaging unit of the invention;

DETAILED DESCRIPTION OF THE INVENTION

Figure 1:
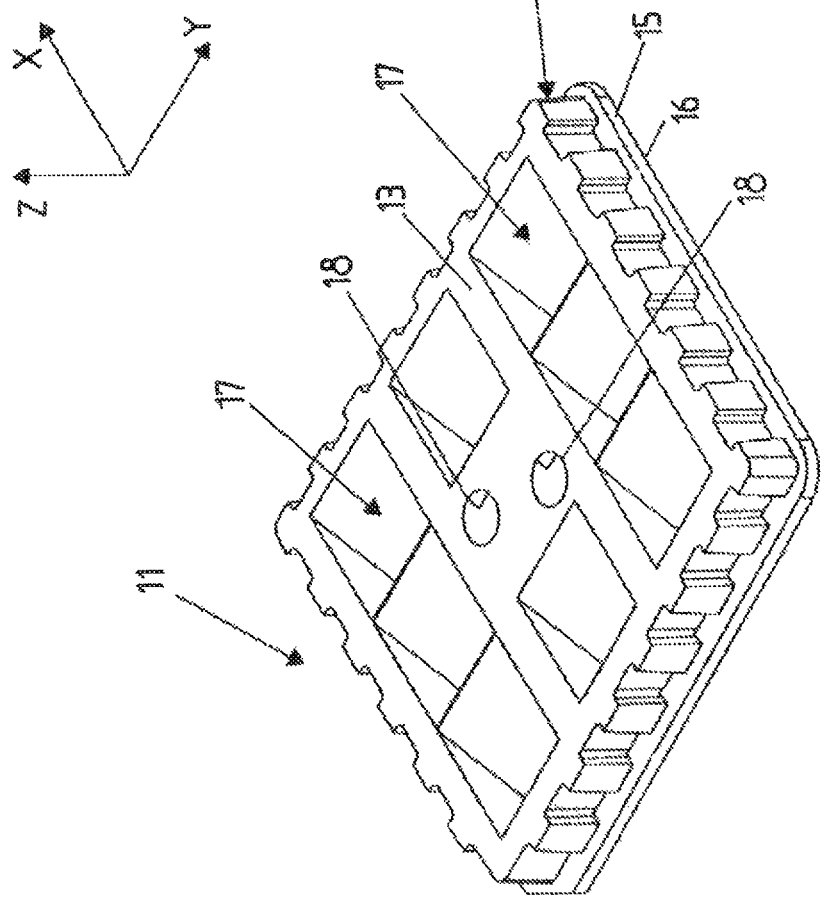
FIG. 1 shows, in a simplified perspective representation and in plan view, a lower packaging part of packaging or a packaging unit formed as a tray by deep drawing, in accordance with the invention.

For simplification and for better comprehension, three mutually perpendicular axes in space are shown in the figures, namely an X axis, a Y axis and a Z axis.

The packaging with general reference numeral 1 in FIGS. 1-7 is intended to accommodate a plurality of substrates; in the embodiment shown, they are in the form of metal-ceramic substrates 2. As can be seen in FIG. 7, these each consist of a ceramic layer 3 which, in a manner known to the skilled person, is provided with a metallization 4 on its respective top and bottom faces, for example by DMB bonding, such as DCB bonding or active brazing. At least the metallization 4 on one of the surfaces of the ceramic layer 3 is structured, in order to form strip conductors, contact surfaces, etc.

The metal-ceramic substrates 2 placed in the packaging 1 each form a parallelepipedal substrate stack 5 formed from a plurality of substrates of this type, which in their respective substrate stacks 5 are stacked sitting one on top of the other or mutually support each other. In the region of a corner border of the substrate stack 5 running perpendicular to the surfaces of the metal-ceramic substrates, a cap-like protective and linking element 6 is positioned which, in the embodiment shown, is produced as a moulded part or a deep drawn part formed from plastic.

Each protective and linking element 6 comprises two limbs 7 and 8 which between them form an angled space and the planes thereof enclose an angle of 90° or essentially 90°. When the protective and/or linking element 6 is placed on the respective substrate stack 5, the inner faces of the limbs 7 and 8 facing the angled space lie on the mutually perpendicular edge sections of the metal-ceramic substrates 2 or their ceramic layers 3 at the corner region of the substrate stack 5 in question.

On two mutually opposing faces, the limbs 7 and 8 are connected together in the embodiment shown via a triangular wall section 9 which here also borders the angled space. When the protective and linking element 6 is set on the substrate stack 5, the respective outer metal-ceramic substrates 2 of the substrate stack 5 or its outlying metallizations 4 lie against the wall sections 9. At the transition between the limb 7 and 8, the protective and linking element 6 is provided with a groove-like enlargement or recess 10 which is open towards the angled space of the limbs, which extends over the whole length of the protective or linking element, i.e. from one wall section 9 to the other wall section 9. The recess 10 ensures that the protective and linking element 6 bears only against the side edges of the metal-ceramic substrates 2 or the ceramic layers 3 and on the metallizations 4 of the outermost metal-ceramic substrates 2, but not on the corners of the ceramic layers 3 accommodated in the recess 10, thus preventing damage occurring to the ceramic layers 3 at the corners in question.

In detail, the packaging 1 consists of a tray-like lower packaging part 11 manufactured by deep drawing a suitable sheet material, preferably a thermoplastic plastic material or a foil of a thermoplastic plastic, and from a lid or lid-like upper packaging part 12 also manufactured from a sheet material by deep drawing. In the embodiment shown, the lower packaging part 11 and correspondingly the upper packaging part 12 too are rectangular in plan view and in this regard are essentially square in shape, each with edges extending in the X and Y axes and with a material thickness in the range from approximately 0.3 mm-4 mm, preferably with a thickness of approximately 1 mm.

The further shaping of the lower packaging part 11 can be described as follows: it has an upper tray or base section 13, which in the embodiment shown in the figures is disposed in the XY plane, a circumferential edge section 14 which is joined to the edges of the base section 13, which in the embodiment shown in the figures is orientated perpendicular to or essentially perpendicular to the XY plane, attached to which is a circumferential edge section 15 which extends outwardly from the edge section 14 in the manner of a flange, which in the embodiment shown in the figures is disposed in the XY plane, and outwardly of this is then a circumferential edge section 16 which in the embodiment shown in the figures protrudes over the underside of the edge section 15 facing away from the edge section 14 in the Z axis direction and is disposed with its surfaces perpendicular to the XY plane. The free lower edge of the edge section 16 forms a pedestal for the lower packaging part 11.

In the base section 13, a plurality of open depressions or indentations 17 are formed on the top face of the lower packaging part 11 which, in the embodiment shown, are identical and each form a seat for at least one substrate stack 5. In the embodiment shown, the lower packaging part 11 has a total of eight such indentations 17 which in the embodiment shown in the figures extend in three rows extending in the X axis direction. The two outer rows, which are each adjacent to the section of the edge section 14 extending in the X axis, each have three indentations 17 and the central row has only two such indentations 17 which are separated from each other in the X axis direction by a distance which is the same or approximately the same length as the length of an indentation 17 in the direction of the X axis. In the embodiment shown, in the region of the base section 13 which is not taken up by an indentation 17 are two circular indentations 18 which are open to the top of the lower packaging part 11 to house a moisture absorbing material, to each accommodate one of the usual packaging desiccant tablets. Further, the indentations 17 are disposed such that they are each at a distance from the edge section 14, and also the indentations 17 of the two outer rows extending in the X axis direction are at a distance from the two indentations 17 of the central row.

Figure 2:
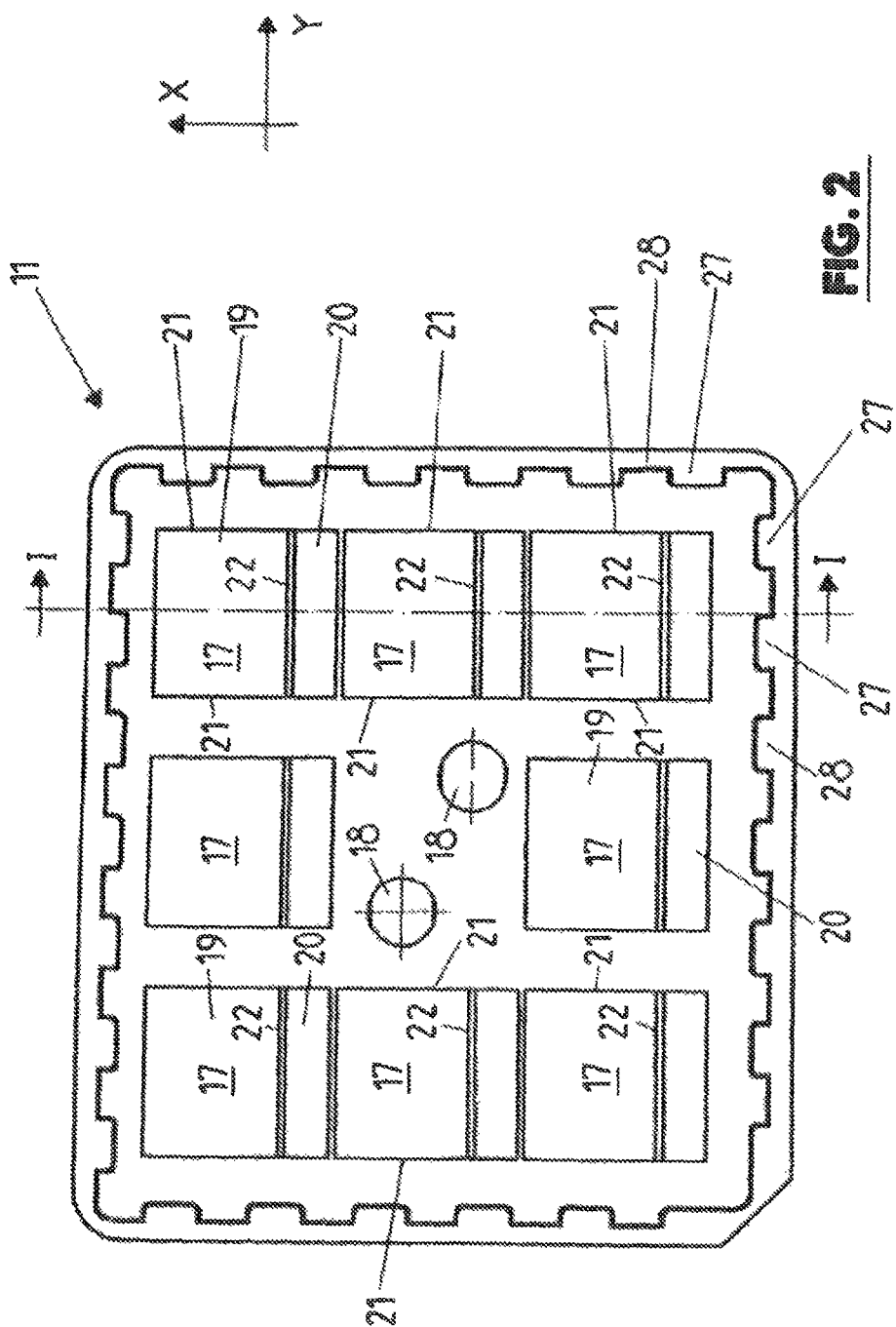
FIG. 2 shows a plan view of the lower packaging part of FIG. 1.
Figure 3:
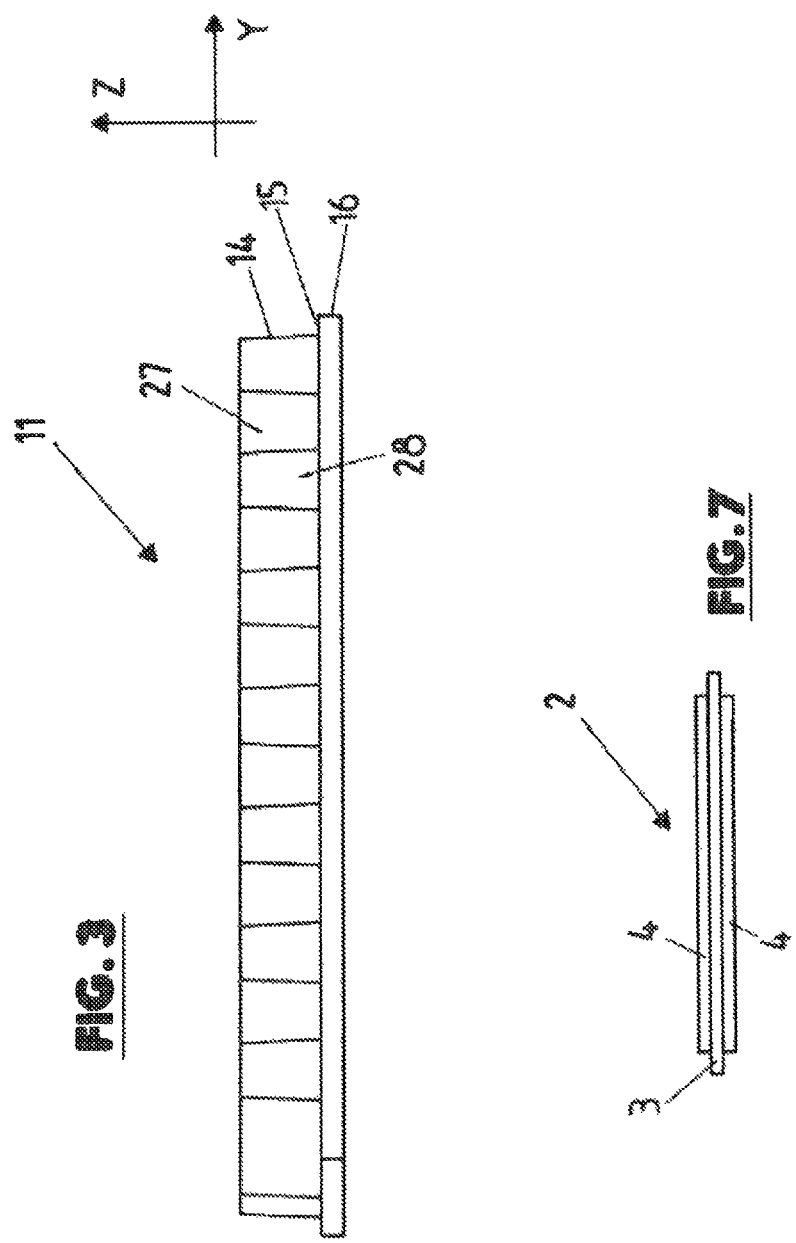
FIG. 3 shows a side view of the lower packaging part of FIG. 1.

In detail, the indentations 17 in the sectional plane shown in FIG. 2 at I-I, which is the XZ plane, have a triangular cross section, and in fact have two wall sections 19 and 20 bordered on the base side by the indentations 17 which enclose an angle of 90° or essentially 90°; in this regard, the respective longer wall section 19 forms an angle $\alpha$ of 30° with the XY plane and the shorter wall section 20 forms an angle $\beta$ of 60° with the XY plane. In the Y plane direction, each indentation 17 is laterally bordered by two wall sections 21 the surfaces of which each are disposed in the XZ plane or essentially in such a plane. At the base of each indentation 17, the transition between the wall sections 19 and 20 is formed such that here, there is a groove-like recess 22 which opens into the indentation 17, which extends in the Y axis direction over the whole width of the respective indentation 17.

In the two outer rows extending in the direction of the X axis, the indentations 17 are joined directly to each other in a manner such that the wall section 19 of an indentation on the top of the lower packaging part 11, i.e. at the level of the base section 13, runs over into the wall section 20 of the next indentation 17. This construction of the lower packaging part 11 and the indentations 17 present therein gives the lower packaging part 11 good mechanical stability.

Figure 4:
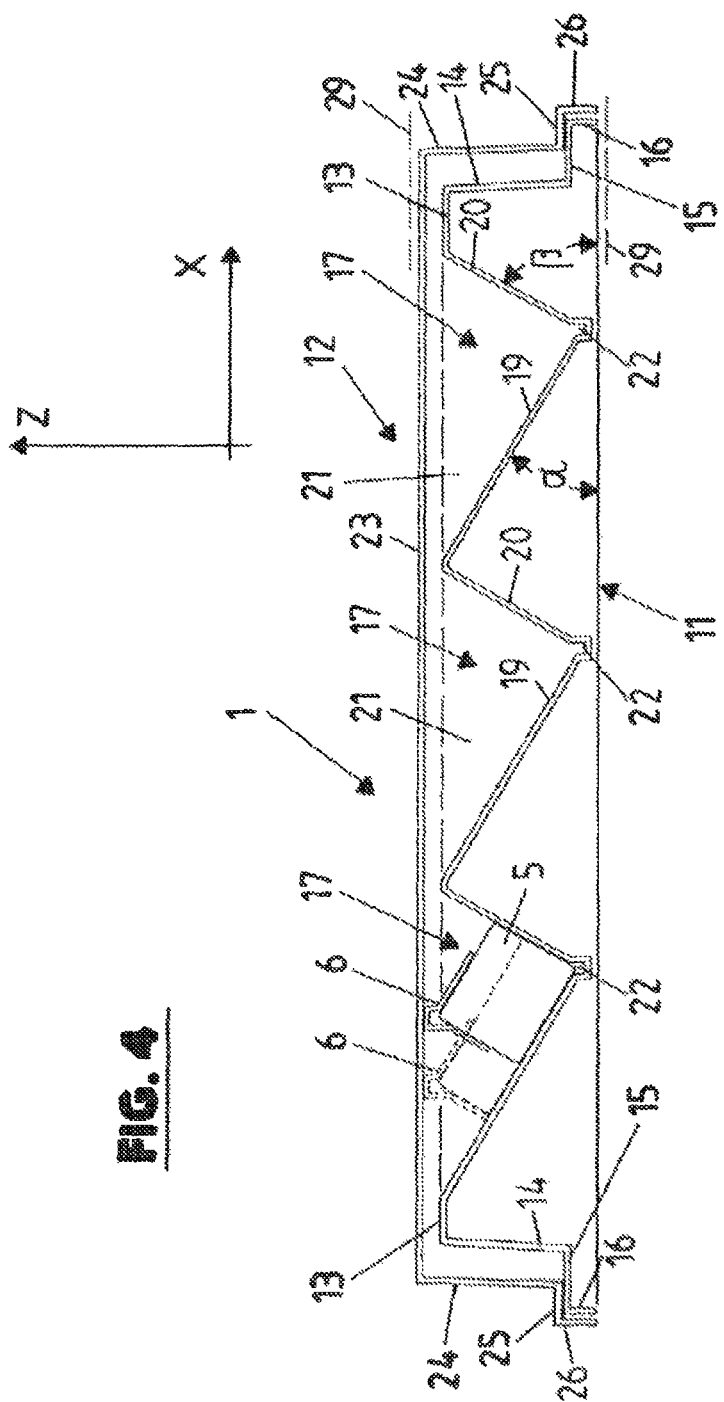
FIG. 4 shows a simplified sectional view through the lower packaging part of FIG. 1 along the sectional line I-I of FIG. 2, together with a upper packaging part formed as a deep drawn lid.

The shape of the lid or upper packaging part 12 can thus be described as follows: in the embodiment shown, it consists of a flat or essentially flat upper lid base 23 which in the embodiment shown in FIG. 4 is disposed in the XY plane, of a circumferential edge section 24 joined to the edge which extends away from the lid base 23 in the Z axis direction, of an attached outwardly extending flange-like edge section 25 which is disposed in the XY plane, and also of an attached circumferential edge section 26 which projects over the lower side of the edge section 25 facing away from the edge section 24.

For the purposes of additional mechanical strengthening of the lower packaging part 11, in the embodiment shown the profile of the edge section 14 is such that a plurality of lateral indentations 27 and intermediate projections 28 are formed at the outside, each extending in the Z axis direction. The edge section 24 of the lid or upper packaging part 12 is profiled in a similar manner, for example, and preferably matched to the profile of the edge section 14 such that the shape of the profile of the edge section 24 of upper packaging part 12 is exactly or substantially the same shape as the profile of the edge section 14.

The substrate stacks 5 provided with the protective and linking elements 6 are each placed in an indentation 17 in a manner such that the metal-ceramic substrates 2 or their ceramic layers 3 lie with the edge sections opposite to the respective protective and linking element 6 sitting against the walls 19 and 20 and the corners in question of the ceramic layers 13 are accommodated in a protected manner in the recess 22. The metal-ceramic substrates 2 accommodated in the respective indentation 17 are then disposed with their faces in the XZ plane or perpendicular to the Y axis. Furthermore, the metal-ceramic substrates 2 are disposed in the respective indentation 17 at an angle such that the edges of the metal-ceramic substrates 2 each enclose an angle with the XY plane which is smaller than 90°, namely the angle α or β. The dimensions of the indentations 17 in the Y axis direction is the same, but preferably slightly smaller than the dimensions of the respective substrate stack 5 in this axial direction, so that each substrate stack 5, even in the part which is not accommodated in the protective and linking element 6, is held together between the two wall sections 21 of the indentation 17 in question and furthermore is held in the indentation 17 in question by a light press fit which does not damage the metal-ceramic substrates.

After inserting the substrate stack 5 in the indentations 17, the upper packaging part 12 is put in position, which then, sits partly with its edge section 25 on the top of the edge section 15 and/or partly with the underside of its base section 23 on the protective and linking element 6; to this end, the top thereof is formed with a flat or essentially flat contact surface.

After positioning the upper packaging part 12, the packaging 1, which is then closed, can optionally be introduced with one or more other packagings 1 into a bag-like wrapper 29 which, is formed from a sleeve-shaped foil. The wrapper 29 is then, after flushing with a protective gas, at least partially evacuated and vacuum sealed, so that external normal atmospheric pressure exerted on the wrapper 29 has the effect of pressing, inter alia, the upper packaging part 12 onto the lower packaging part 11 and thus secures it thereto. At the same time, the metal-ceramic substrates 2 are also seated into the indentations 17. Forces resulting from the external normal atmospheric pressure directed in the Y axis direction exerted on the packaging or the edge section 14, by means of a certain deformation of the lower packaging part 11, also produce an additional clamping or bracing of the substrate stack 5 on the outer metal-ceramic substrates 2 in the corresponding indentation 17, so that, inter alia, rubbing of the metal-ceramic substrates 2 against each other during transport or handling is avoided. The foil forming the wrapper 29 is preferably multi-layered and in fact consists of a heat-sealable inner layer of thermoplastic plastic material and an outer protective layer which in particular prevents the ingress of air and/or moisture.

In the foregoing, it was assumed that the lid base 23 of the upper packaging part 12 was flat or essentially flat. Preferably, however, in order to increase the rigidity of the upper packaging part 12, the base section 23 is profiled, in fact, by means of fillets or groove-like indentations which are formed in the base section 23 in places which do not sit against the protective or linking element 6.

First of all, an essential advantage of the packaging 1 is that, because of the specific construction of the indentations 17 in the packaging 1, board-like products, in particular including substrates or metal-ceramic substrates 2 with different shapes, for example square or rectangular substrates, even those with different sizes, can be accommodated. Furthermore, the lower packaging part 11 in particular is optimally suited for use as a seat or repository for such substrates. The sensitive corners of the metal-ceramic substrates or ceramic layers 3 or other substrates are kept away from mechanical loads by means of the described construction of the protective and linking elements 6 and the indentation 17.

Figure 8:
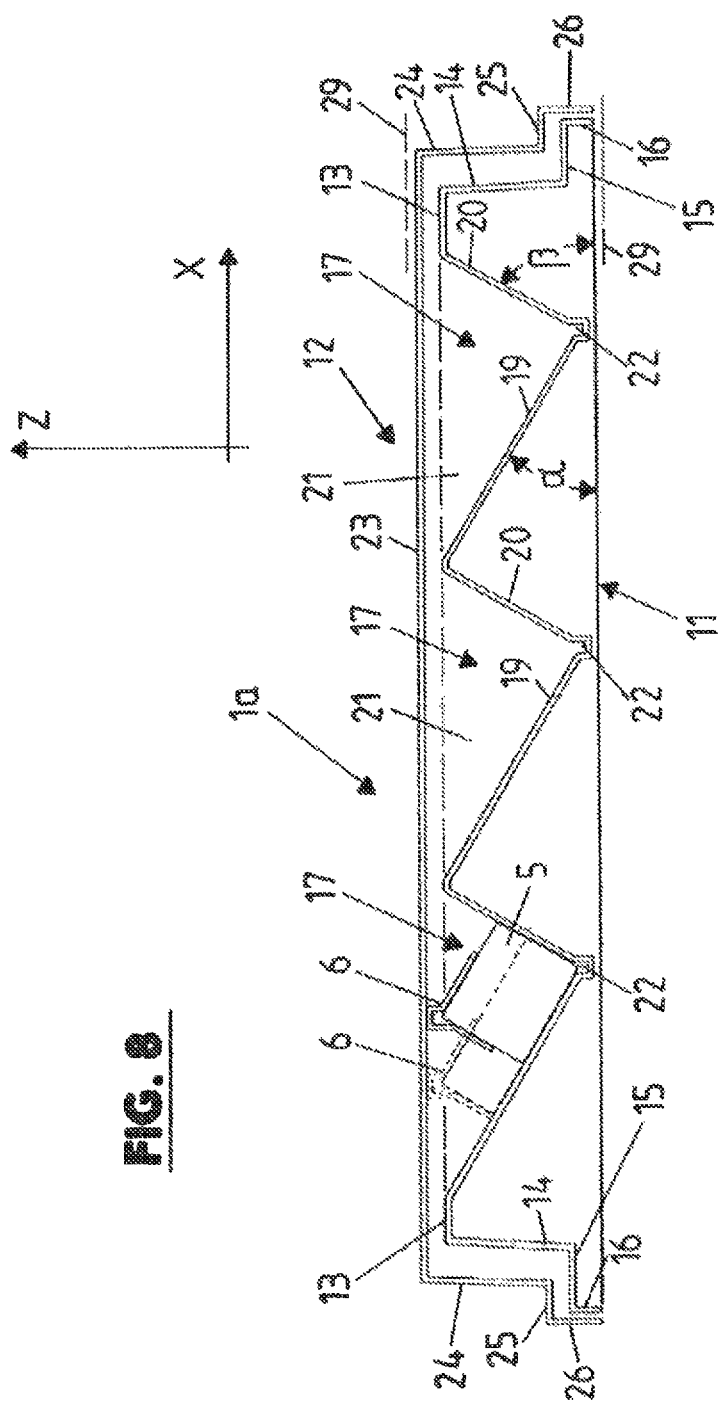
FIG. 8 shows a view similar to FIG. 4 in a further embodiment of the packaging or packaging unit of the invention.

In a view similar to FIG. 4, FIG. 8 shows a further embodiment of a packaging 1a which only differs from the packaging 1 in that when the packaging 1a is closed, i.e. when the upper packaging part 12 is placed on the lower packaging part 11, the edge section 25 is at a distance from the edge section 15, so that the upper packaging part 12 bears on the lower packaging part 11 via the protective and linking elements 6 and the substrate stacks 5. Otherwise, the packaging 1a is identical to the packaging 1, so that the above discussion regarding the construction of the packaging 1, its mode of use, advantages etc., are also valid for the packaging 1a. The distance between the edge sections 25 and 15 is smaller than the length of the edge section 26 in the X axis direction so that the edge sections 16 and 26 provide a guide for the upper packaging part 12 on the lower packaging part 11.

Figure 9:
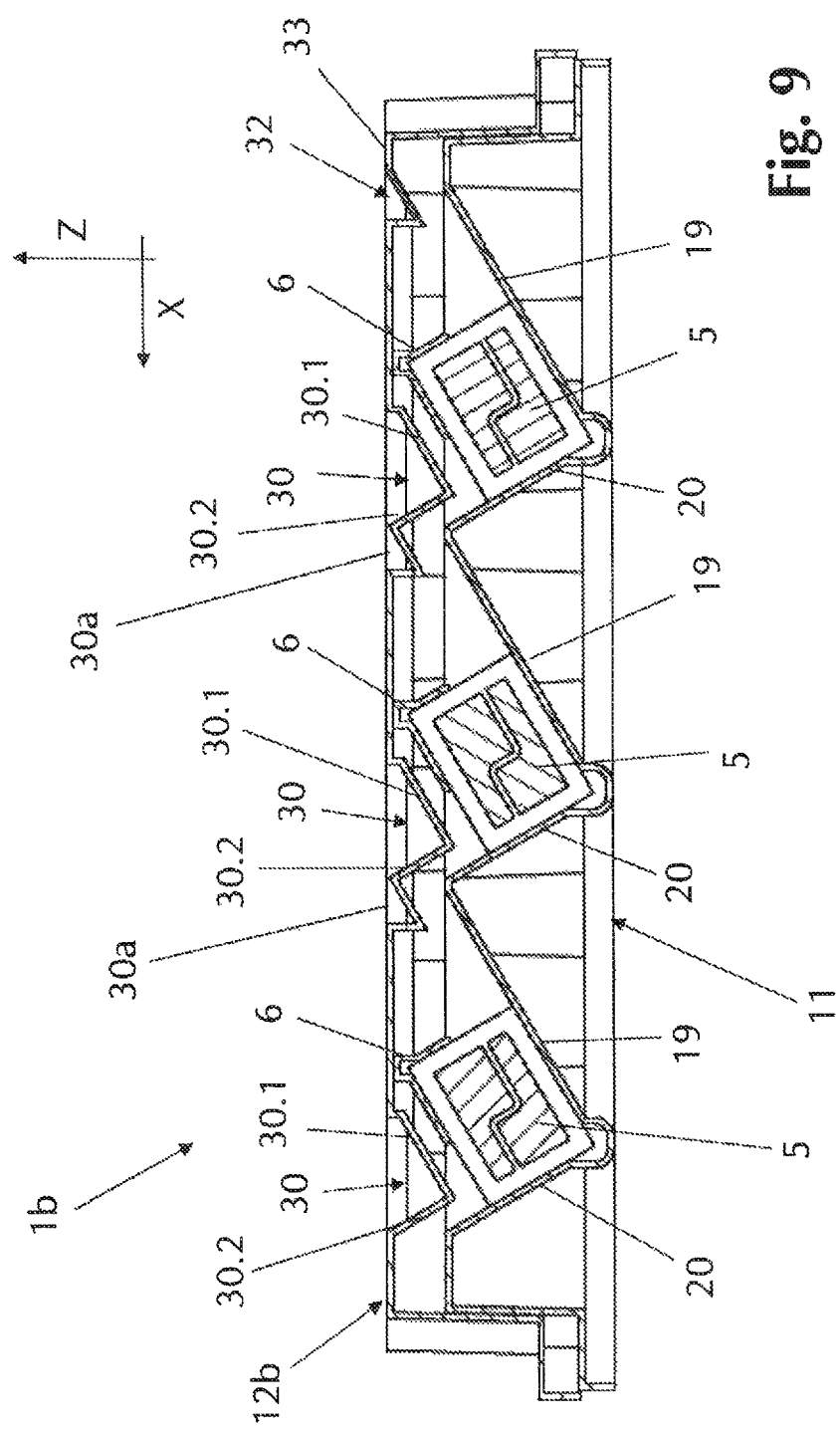
FIG. 9 shows, in a sectional view similar to FIG. 4, a further embodiment of packaging or a packaging unit in accordance with the invention.

FIG. 9 shows, in a simplified illustration, a section through packaging 1b which essentially differs from the packaging 1 in that instead of a lid or upper packaging part 12, a lid or upper packaging part 12b is used which comprises a plurality of indentations 30-32 on its upper lid base 23b, of a shape such that in the region of these indentations 30-32, the lid base protrudes into the internal space of the packaging 1b. In this manner, the internal space of the sealed packaging 1b not taken up by the metal-ceramic substrates 2 is reduced, or the air and/or gas and/or vapour volume is reduced, and in association therewith, there is also a reduction in the moisture content in the packaging 1b, in fact backing up the moisture absorbing material located in the indentations 18 of the lower packaging part 11 or the desiccant tablet housed therein.

Figure 10:
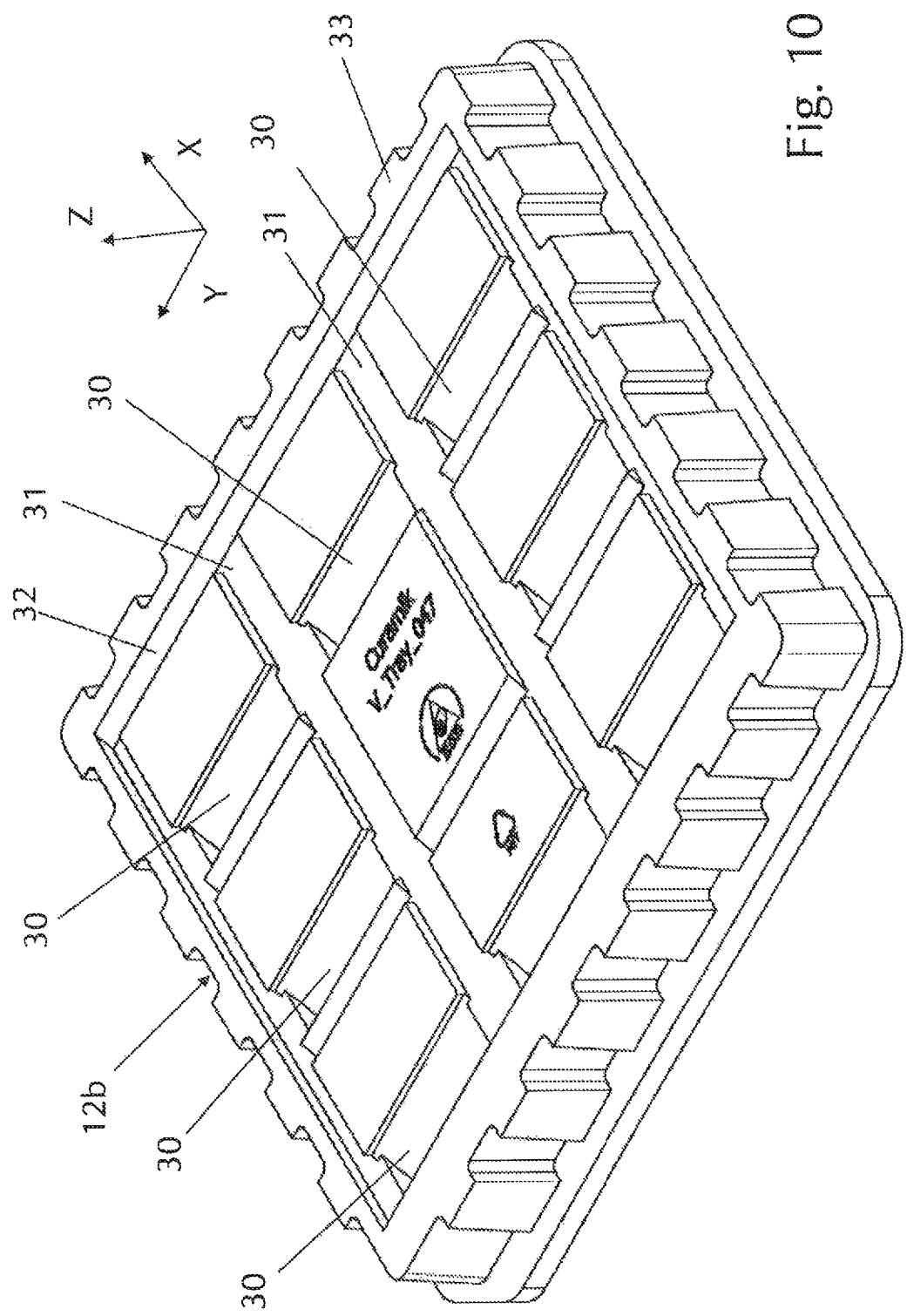
FIG. 10 shows, in perspective view and in plan view, the upper packaging part or lid of the packaging or packaging unit of FIG. 7.

As can be seen in particular in FIG. 10, a plurality of indentations 30 are provided; in fact, one indentation 30 is provided for each substrate seat 17, which indentation forms two inclined wall sections 30.1 and 30.2 in the sectional plane of FIG. 9; when the lid or upper packaging part 12b is positioned on the lower packaging part 11, the wall section 30.1 is parallel to or essentially parallel to the wall section 19 and the wall section 30.2 is parallel to or essentially parallel to the wall section 20 of the corresponding substrate seat 17. In the embodiment shown, the wall sections 30.1 and 30.2 also enclose an angle of 90° or essentially 90°. At the two wall sections 21, each indentation 30 forms a wall section 30.3 which is also parallel to the associated wall section 21, i.e. perpendicular or essentially perpendicular to the plane of the upper lid base 23b or the XY plane. In addition to the indentations 30, which are arranged in the X axis direction in the arrangement of the substrate seats 17 in three rows between which even smaller indentations 30a are provided, in the upper lid base 23b between these rows are indentations 31 extending in the direction of the X axis. The circumferential indentation 32 is provided along the edge 33 of the upper lid base 23b. The lid or the upper packaging part 12b is also manufactured by deep drawing using a plastic foil. The lower packaging part 11 of the packaging 1b is constructed as described for the packaging 1.

In order to ensure that the metal-ceramic substrates 2 accommodated in the respective packaging 1, 1a or 1b do not move with respect to each other and rub against each other in their respective seat 17 during transport or other handling of the packaging or the packaging unit comprising this packaging, but are fixed in the substrate seats 17 by cooperation of the protective and linking elements 6 and above all by the forces exerted on the packaging resulting from the surrounding pressure when the wrapper 29 is closed and evacuated, it is necessary for the respective substrate seat or indentation 17 to be completely filled with metal-ceramic substrates 2 sitting one directly against the other and/or supporting each other in a stack.

FIG. 11 shows a further embodiment of a packaging 1c which makes it possible, at least in individual substrate seats or indentations 17, for part quantities or part stacks of metal-ceramic substrates 2 to be accommodated without problems regarding secure storage of the metal-ceramic substrates 2. This is made possible by means of a specific construction of the protective and linking element 6c used instead of the protective and linking elements 6.

The protective and linking elements 6c, like the protective and linking elements 6, are produced from a plastic foil by deep drawing and in fact are again formed as angled parts with two limbs 7 and 8 and the wall sections 9 at both ends of the angled space 34 formed by the limbs 7 and 8. The limbs 7 and 8 again enclose an angle of 90° or essentially 90°.

Figure 13:
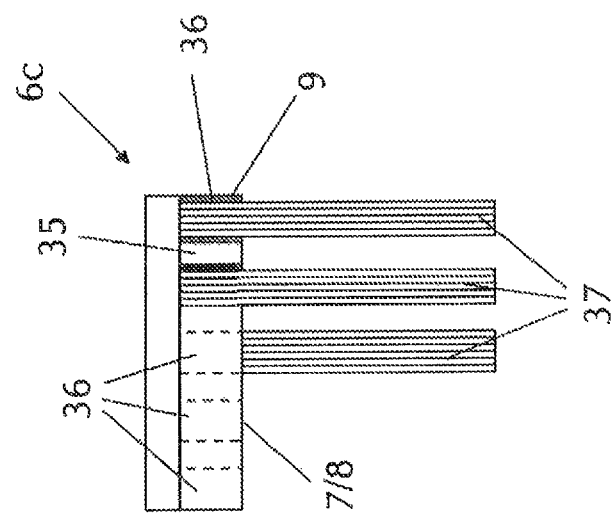
FIGS. 12, 13 each individually show, in two different side views, a plurality of individual stacks each formed from respective circuit boards formed from a metal-ceramic substrate, together with protective or linking elements in a further embodiment of the packaging or packaging unit of the invention.
Figure 12:
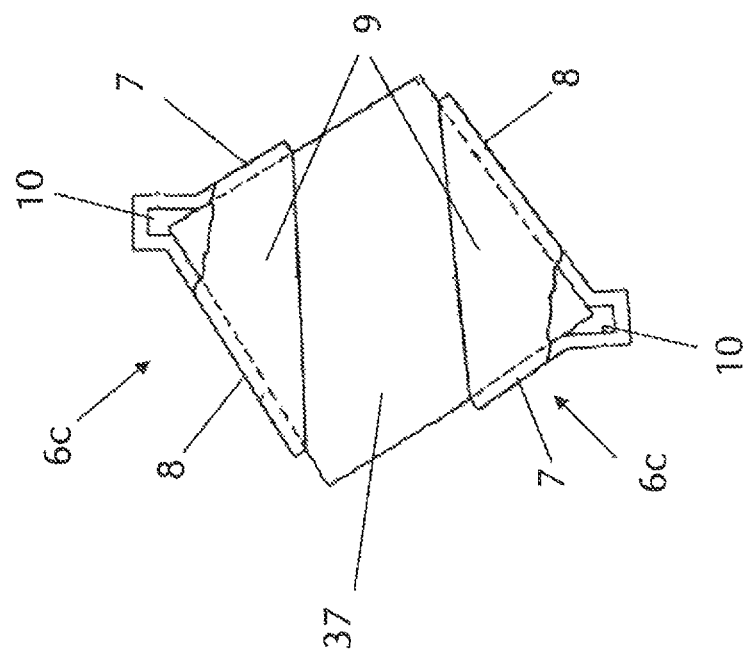
Figure 14:
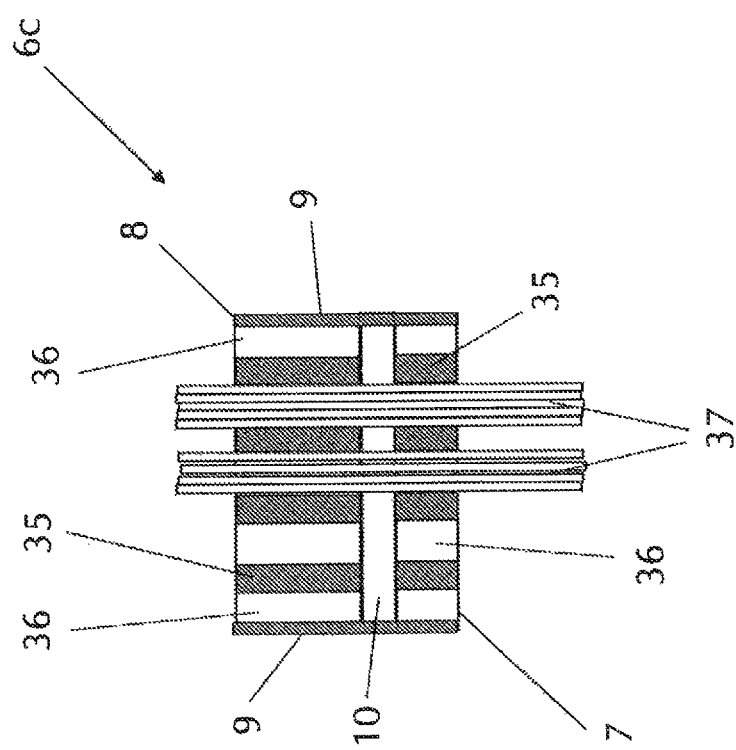
FIG. 14 shows, in simplified view, a view of the inside of a protective or linking element formed as an angled part with a plurality of metal-ceramic substrates.

The wall sections 9 are orientated perpendicular to the planes of the limbs 7 and 8. The particular feature of the protective and linking element 6c lies in the fact that the limbs 7 and 8 are each formed with a plurality of fillet-like projections or impressions 35 with their longitudinal extent orientated perpendicular to the angled corner protruding into the angled space between the limbs 7 and 8 so that compartments 36 are formed between the outer wall sections 9 and the adjacent projection 35 as well as between pairs of projections 35 on the inside of the limbs 7 and 8, the width of the compartments corresponding to the thickness of a part stack 37 formed from a plurality of metal-ceramic substrates 2 sitting one on top of the other in a stack (FIGS. 12-14).

In a departure from the packagings 1, 1a, 1b, the protective and linking elements 6c are not only used on the corner of the metal-ceramic substrates 2 or part stack 37 adjacent to the lid base 23b, but are also provided in the substrate seats 17 so that the metal-ceramic substrates 2 or the part stacks 37 are also securely held on their corner region of the respective substrate seat or indentation 17 in a compartment 36 of the protective and linking element 6c fitted and held in the substrate seat or indentation 17.

In the embodiment of FIG. 11, for all of the metal-ceramic substrates 2 or part stack 36 accommodated in the packaging 1c, it is assumed that upper and lower protective and linking elements are used. Clearly, in one and the same packaging, it is possible to use the protective and linking element 6c to securely hold part stacks 37 of metal-ceramic substrates 2 in only one substrate seat or indentation 17 or only a portion of the substrate seats or indentations 17, while other substrate seats or indentations 17 are completely filled with metal-ceramic substrates 2 wherein only the upper protective and linking elements 6c are employed.

The invention has been described herein with the use of exemplary embodiments. It will be understood that many modifications and changes are possible without departing from the inventive concept underlying the invention.

LIST OF REFERENCE NUMERALS 1, 1a, 1b, 1c packaging
2 substrate, metal-ceramic substrate
3 ceramic layer
4 metallization
5 substrate stack
6, 6c protective and linking element
7, 8 limb
9 wall section
10 recess
11 lower packaging part
12, 12b upper packaging part
13 base section
14, 15, 16 edge section
17 indentation or substrate seat
18 indentation
19, 20, 21 wall section
22 recess
23, 23b base wall
24, 25, 26 edge section
27 indentation
28 projection
29 wrapper
30-32, 30a indentation
30.1-30.3 wall section
33 lid base edge
34 angled space
35 projection or impression
36 compartments
37 part stack
X, Y, Z spatial axis

The invention claimed is:

1. A packaging unit for metal-ceramic substrates, comprising:
a tray-like lower packaging part formed from a sheet material, and having at least one seat formed by an indentation in an upper base section of the tray-like lower packaging part for holding a plurality of substrates collected together into a substrate stack or a part stack, wherein the indentation is constructed to arrange the substrates with a substrate top being essentially perpendicular to a first plane of the base section and the indentation comprises at least two lateral structures for outermost substrates in the substrate stack or the part stack, the at least two lateral structures are at a distance from each other in a first axial direction, and at least one indentation forms a structure with a base for at least an edge region of the substrates, which encloses an angle ($\alpha$, $\beta$) of less than 90° with the first plane;
a lid-like upper packaging part;
at least one cap-like protective or linking element for placing on the substrate stack or the part stack accommodated in or to be accommodated in the at least one indentation; and
a bag-like wrapper which accommodates the packaging unit and is formed from a sheet material or a foil, the bag-like wrapper forms a sealed internal space which accommodates the tray-like lower packaging part and the lid-like upper packaging part.

2. The packaging unit as claimed in claim 1, wherein the at least two lateral structures form contact surfaces which are disposed in a second plane perpendicular to or essentially perpendicular to the first plane.

3. The packaging unit as claimed in claim 1, wherein the base of the at least one indentation is formed by at least two wall sections which enclose an angle of essentially 90°, and the at least two wall sections are disposed in planes which enclose an angle with the first plane of the base section, and the at least two wall sections form the contact surfaces for two edge regions of the substrates connected at essentially at right angles.

4. The packaging unit as claimed in claim 3, wherein the at least two wall sections forming the base of the at least one indentation are inclined at different angles with respect to the first plane of the base section, with a first wall section at an angle ($\alpha$) of approximately 30°, and a second wall section at an angle ($\beta$) of approximately 60°.

5. The packaging unit as claimed in claim 3, wherein the at least one indentation is formed at the base, at a transition between the at least two wall sections forming the base with a recess for accommodating corner regions of the substrates.

6. The packaging unit as claimed in claim 1, wherein the tray-like lower packaging part is formed with a circumferential edge which extends away from an underside of the base section, the circumferential edge being formed by at least two edge sections connected to each other, wherein at least one circumferential edge section includes a flange that protrudes over the periphery of the tray-like lower packaging part.

7. The packaging unit as claimed in claim 6, wherein when a plurality of substrate stacks are accommodated in a respective indentation, at least one protective or linking element is provided for the substrate stack or the part stack.

8. The packaging unit as claimed in claim 7, wherein the at least one protective or linking element has two limbs which together form an angled profile enclosing an angle of essentially 90°, and has two wall sections provided at ends of the angled profile which connect the two limbs together, wherein at a transition between the two limbs, a recess or enlargement is provided to accommodate the corner regions of the substrates of the substrate stack.

9. The packaging unit as claimed in claim 7, wherein the at least one protective or linking element is formed with two limbs which enclose an angle of essentially 90° to form an angled profile, and in that lateral structures are formed on the two limbs to constitute compartments for part stacks in order to each accommodate a part stack.

10. The packaging unit as claimed in claim 1, wherein the tray-like lower packaging part comprises a plurality of indentations each for accommodating at least one substrate stack or part stack, the tray-like lower packaging part is rectangular or square in a plan view over the base section, and at least two indentations each for accommodating at least one substrate stack or part stack are introduced into the base section.

11. The packaging unit as claimed in claim 1, wherein the tray-like lower packaging part comprises at least one other seat formed by a further indentation for accommodating a moisture absorbing material.

12. The packaging unit as claimed in claim 1, wherein the tray-like lower packaging part forms a lower packaging part, and the lid-like upper packaging part can be placed on the tray-like lower packaging part, and the lid-like upper packaging part is constructed with an upper lid base and with a lid edge which surrounds an edge of the tray-like upper packaging part and is made from a sheet material by deep drawing.

13. The packaging unit as claimed in claim 12, wherein when the packaging unit is closed, an upper lid base section of the lid-like upper packaging part lies against a protective or linking element placed on the at least one substrate stack.

14. The packaging unit as claimed in claim 12, wherein in order to reduce an internal volume of a closed packaging unit not taken up by the substrates, the upper lid base of the lid-like upper packaging part is formed with impressions or indentations which extend into an internal volume thereof.

15. The packaging unit as claimed in claim 14, wherein a first impression or indentation is provided in the lid-like upper packaging part for each substrate seat, the impression or indentation is formed parallel to structures of wall sections running through the substrate seat.

16. The packaging unit as claimed in claim 14, wherein the upper lid base is formed with at least one second impression or indentation running between the impressions or indentations with a circumferential impression or indentation along an edge region of the lid-like upper packaging part.

\* \* \* \* \*